United States Patent [19]

Wells

[11] Patent Number: 4,480,293

[45] Date of Patent: Oct. 30, 1984

[54] LIGHTED SWEAT SHIRT

[75] Inventor: Peggy S. Wells, Sand Springs, Okla.

[73] Assignee: PSW, Inc., Sand Springs, Okla.

[21] Appl. No.: 541,886

[22] Filed: Oct. 14, 1983

[51] Int. Cl.³ ............................................. F21L 15/14
[52] U.S. Cl. ..................................... 362/108; 362/103; 362/249; 362/252; 362/800; 362/806; 362/808
[58] Field of Search ............... 362/103, 108, 800, 249, 362/252, 806, 808

[56] References Cited

U.S. PATENT DOCUMENTS 4,164,008 8/1979 Miller et al. ...................... 362/800

Primary Examiner—Stephen J. Lechert, Jr.
Attorney, Agent, or Firm—Head, Johnson & Stevenson

[57] ABSTRACT

This invention relates to improvements in wearing apparel and more particularly, but not by way of limitation, to a lighted sweat shirt.

9 Claims, 5 Drawing Figures

LIGHTED SWEAT SHIRT

DESCRIPTION OF THE PRIOR ART

Lighted wearing apparel, such as sweat shirts, hats, and the like, have been become popular in recent time as novelty items, and attention attracting apparel for many purposes. The present available lighted wearing apparel of this type comprises the use of a plurality of light emitting diodes disposed on one side of the garment, such as on the outer side of a sweat shirt, with the prongs of the diode extending through the material of the shirt and into connection with suitable electrical wiring disposed against the inner side of the material. The electrical wiring is usually covered by means of a secondary fabric or other suitable material stitched or otherwise adhered to the material of the shirt in a manner for encasing the wires between the material of the shirt itself and the backing fabric. A suitable switch block means, or the like, extends from the wiring, which is essentially sandwiched between the two pieces of fabric, and a battery pack, or the like, may be electrically connected with the switch block means for supplying current to the electrical wiring system of the shirt. When the electrical system is energized, the diodes emit a light. The diodes may be arranged on the front or outer surface of the shirt in accordance with a particular design or pattern on the shirt, and may be programmed for intermittent energization whereby the lights blink in accordance with a preselected sequence, thus providing an interesting effect for the light shirt. One disadvantage of the lighted apparel presently available is the presence of the relatively large number of electrical wires normally required for achieving the desired visual effect. In the case of a sweat shirt, the wires are of a bulky feeling against the body of the wearer of the shirt, which is a disadvantage, and in addition, the cleaning or washing of the shirt presents a problem.

SUMMARY OF THE INVENTION

The present invention contemplates a novel lighted wearing apparel, such as a sweat shirt, which has been particularly designed and constructed for overcoming the foregoing disadvantages. The novel sweat shirt is preferably provided with a preselected design embossed, imprinted, or otherwise applied to the outer surface of the front of the shirt, and a printed circuit means is disposed against the inner surface of the front of the shirt substantially immediately behind the design. The circuit means is printed on a flexible plastic material which conforms generally to the fabric against which it is disposed, and the circuit printed thereon is one which has been particularly selected to conform to the design provided on the outer surface of the shirt front. A plurality of pairs of relatively small apertures are provided on the circuit board or sheet arranged properly with respect to the circuit printed thereon, and disposed in orientation or alignment with respect to the pattern or design provided on the outer surface of the shirt. A diode is provided for each pair of apertures, and the prongs of the diode extend through the material of the shirt and into the proper pair of apertures whereby electrical current or energy will be supplied to the diode. Of course, a suitable covering fabric is disposed over the circuit board and is stitched, glued, or otherwise secured to the shirt material for sandwiching the circuit board therebetween. A suitable switch block extends from the circuit board and is accessible for connection with a suitable battery pack, which may be carried in a pocket, or the like. When the battery pack is engaged with the switch block means and energized, the diodes will be activated for producing a light corresponding to the design on the front of the shirt. Of course, the circuit may be programmed for producing selected blinking of the lights, thus enhancing the overall effect of the lighted shirt. The use of the novel printed circuit board or sheet eliminates the need for the multiplicity of wires, thus greatly reducing the bulky nature of the shirt while wearing thereof. In addition, the cleaning or washing of the shirt is simplified by the use of the printed circuit means in lieu of the electrical wiring. The novel lighted garment or apparel is simple and efficient in operation and economical and durable in construction.

DETAILED DESCRIPTION OF THE PREFERRED EMBODIMENT

Figure 1:
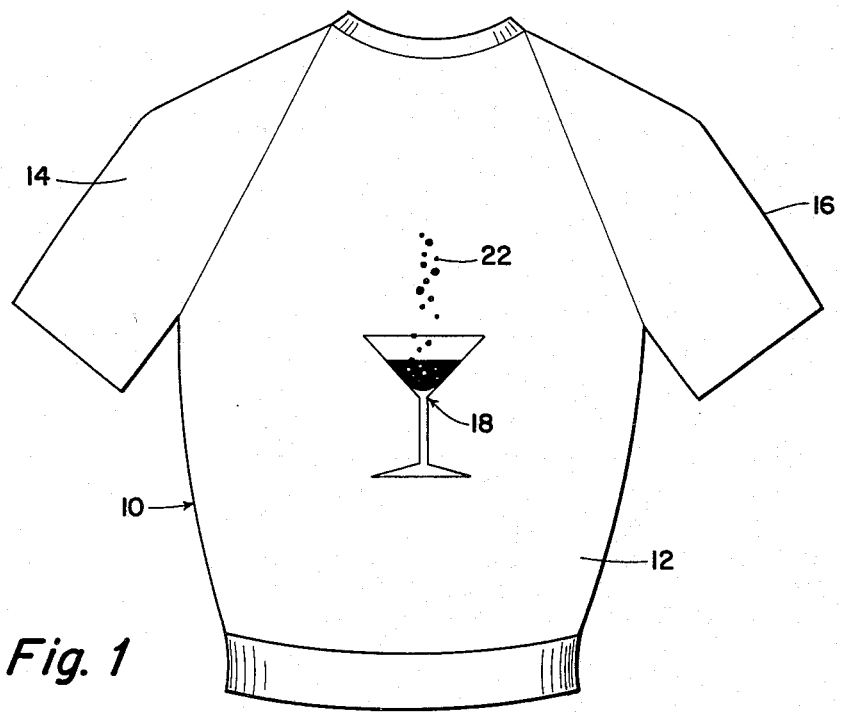
FIG. 1 is a front elevational view of a sweat shirt embodying the invention.

Referring to the drawings in detail, reference character 10 generally indicated a lighted sweat shirt comprising a front section 12, a back section (not shown) preferably generally similar in configuration to the front section, and the usual sleeves 14 and 16. Whereas the garment 10 may be constructed from any suitable material, it is preferably that the shirt 10 be constructed from any well known sweat shirt jersey material which is normally relatively heavy or thick and pliable.

The design 18 may be substantially any desired pictorial representation, and as shown herein is a rendition of a cocktail or champagne glass 20 having the bubbles 22 illustrated as rising upwardly therefrom. A printed circuit board or sheet for complementary utilization with the particularly design 18 is shown at 24 in FIG. 4 and comprises an elongated sheet of any suitable plastic material, or the like, such as a two mil Mylar (a trademark of E. I. du Pont de Nemours, Inc.) plastic, having an electrical circuit 26 printed thereon in the usual or well known manner.

Figure 4:
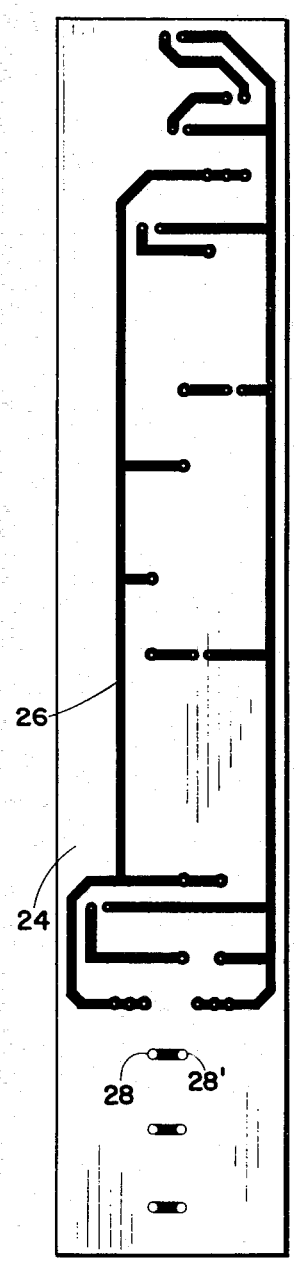
FIG. 4 is a plan view of a printed circuit board or sheet as may utilized in the construction of a sweat shirt embodying the invention.
Figure 5:
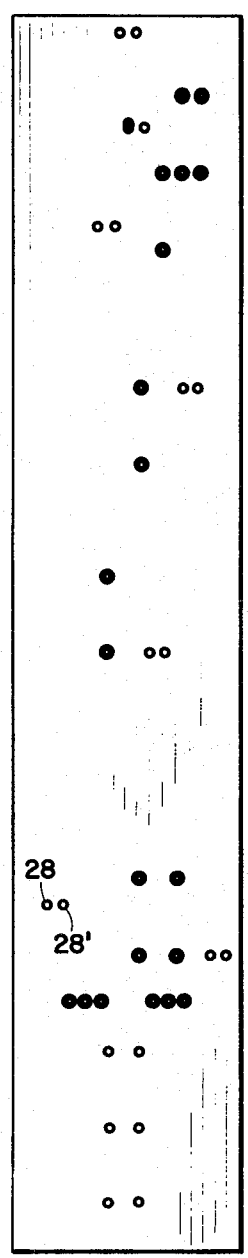
FIG. 5 is a plan view of a light emitting diode positioning pattern for a printed circuit board as may be utilized in the construction of a sweat shirt embodying the invention.

The particular circuit 26 shown in FIG. 4 is selected in accordance with the desired lighting pattern for the champagne glass 20 and bubble 22 design on the front of the shirt 10. A plurality of pairs of relatively small apertures 28—28' are provided in the sheet 24 and the apertures 28 and 28' of each pair are spaced apart a distance corresponding to the prongs 29 of the usual well known light emitting diode 30 for a purpose as will be hereinafter set forth. In addition, the pairs of apertures 28—28' are spaced throughout the circuit 26 in a particularly selected arrangement corresponding to the spacing of at least some of the bubbles 22 present on the front of the shirt 10 whereby the sheet 24 may be positioned against the inner or underside of the front 12 in such a manner that each pair of apertures 28—28' may be disposed in substantial alignment with selected bubbles 22 of the design 18. When the circuit board or sheet 24 has thus been positioned against the inner surface of the front section 12, a suitable fabric or sheet 32 may be placed over the sheet 24 for concealing thereof. The sheet 32 is of a planar size sufficiently large for completely covering the sheet 24, and the peripheral edges of the sheet 32 may be secured to the inner surface of the front section 12 in any suitable manner, such as by stitching, glueing, or the like, thus sandwiching the sheet 24 between the front section 12 and the sheet 32.

Figure 3:
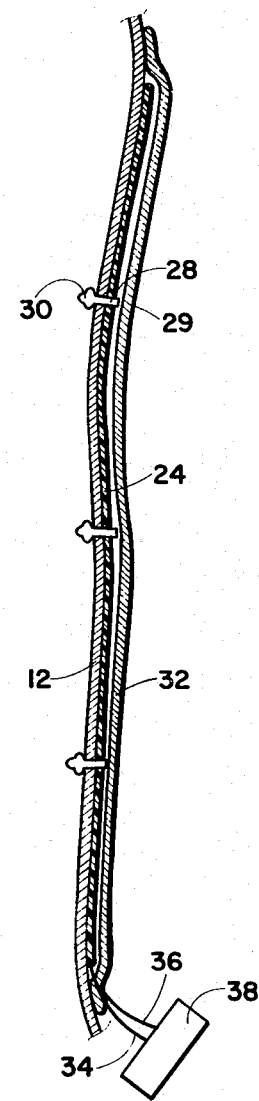
FIG. 3 is a view taken on line 3—3 of FIG. 2.

Suitable electric connection wires 34 and 36 extend from the printed circuit 26 of the circuit board 24 into operable connection with a suitable connector block, switch block, or the like as shown at 38 in FIG. 3. The connector block means 38 is disposed exteriorly of the sheet 32 and is accessible from the inner or back surface of the front section 12. A suitable battery or power pack (not shown) of any well known type may be operably connected with the connector block means 38 for supplying power thereto, and the battery pack may be stored in a pocket, or the like, normally present on the garments worn by the user of the shirt 10. Of course, it may be desirable to provide a pocket means (not shown) on the garment or shirt 12 for storing of the power pack means. The circuitry programmed in the power pack means is particularly designed for cooperation with the particular printed circuit 26 to provide the desired end result in connection with the activation of the light emitting diodes 30 for producing the end result for the attraction of the light sweat shirt 10.

In use, the particular design 18 shown herein and circuit 26 complementary thereto utilizes a plurality of light emitting diodes 30 in association with selected bubbles 22 of the design. Each diode 30 required to achieve the desired end effect may be secured to the front section 12 of the shirt 10 by inserting the prongs 29 through the fabric of the front section 12 and into the associated pair of apertures 28—28' of the circuit 26. This not only positions the diodes 30 in electrical connection with the circuit 26, but also functions to secure the sheet 24 securely in position against or in the proximity of the inner surface of the front section 12. The circuitry programmed in the battery pack means (not shown) provides selective intermittent activation of the diodes 30 to produce an effect simulating the rising of the bubbles 22 from the glass 20 and upwardly along the front section 12.

Figure 2:
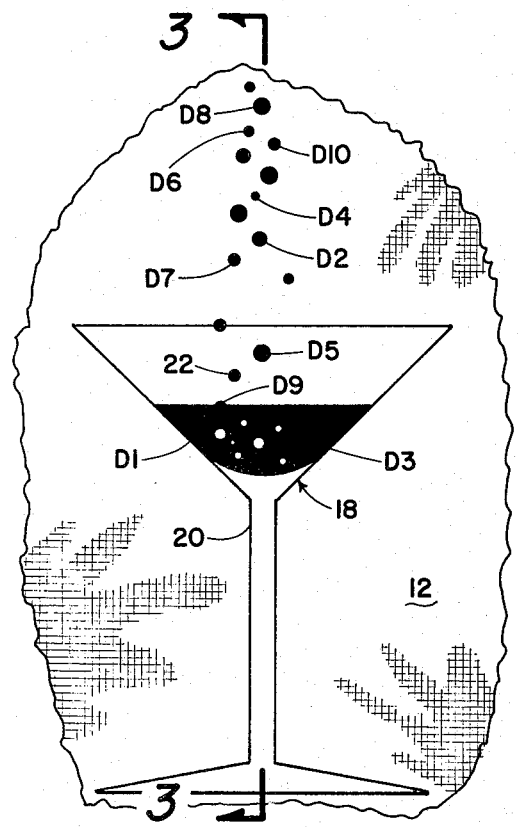
FIG. 2 is an enlarged front elevational view of a portion of a sweat shirt embodying the invention.

For example, as particularly shown in FIG. 2, the diodes positioned or secured as indicated at $D_1$ and $D_2$ are activated and deactivated simultaneously to produce a common blinking action between the two diodes. Similar, the pair of diodes $D_3$ and $D_4$ are programmed for simultaneous intermittent activation; the diodes $D_5$ and $D_6$ are "paired" for common intermittent activation; the diodes $D_7$ and $D_8$ are similarly "paired"; and the diodes $D_9$ and $D_{10}$ are arranged to provide a common blinking action. The overall result of the programmed activation of the diodes 30 associated with the particular design 18 illustrated herein results in producing the effect of bubbles rising from a glass of champagne.

Whereas the particular wearing apparel or garment shown herein and described in detail herein is a sweat shirt, and whereas the particular lighted design illustrated herein is a champagne glass and associated bubbles, it is to be understood that substantially any wearing apparel or garment may be provided with a similar lighting or illumination effect by the use of a printed circuit board or sheet such as the sheet 24 and circuit 26 in combination with the light emitting diodes 30. The lighting effect may be utilized with eye shades, hats, belts, or substantially any desired accessory or garment, as desired.

From the foregoing it will be apparent that the present invention provides a novel illuminated or lighted garment wherein light emitting diodes are utilized in combination with a printed circuit which is produced on a plastic material, such as Mylar. The printed circuit may be secured adjacent one side of a piece of fabric, or the like, by inserting the prongs of the diodes through the fabric from the opposite side thereof and engaging the prongs with apertures provided in the circuit board means. The circuit may be operably connected with a suitable power source which is programmed for intermitting actuation of the diodes to produce substantially any desired end result in combination with substantially any decorative or design work applied to the garment.

Whereas the present invention has been described in particular relation to the drawings attached hereto, it should be understood that other and further modifications, apart from those shown or suggested herein may be made within the spirit and scope of this invention.

What is claimed is:

1. An illuminated object comprising a first surface to be illuminated, a second surface in back to back relation with respect to the first surface, flexible circuit board means disposed in the proximity of the second surface and having an electrical circuit impressed thereon, light emitting diode means positioned in the proximity of the first surface and extending therethrough into removeable connection with the circuit board means for securing the circuit board means to the second surface and for operable electrical connection with the electrical circuit for activation thereby.

2. An illuminated object as set forth in claim 1 wherein the object is wearing apparel.

3. An illuminated object as set forth in claim 1 and including means disposed over the circuit board means and secured to the second surface for sandwiching the circuit board means therebetween.

4. An illuminated garment comprising a first surface having a decorative design thereto, a second surface applied thereto, a second surface disposed in back to back relation with respect to the first surface, a flexible circuit board means disposed in the proximity of the second surface and having an electrical circuit printed thereon, light emitting diode means disposed in the proximity of the first surface and extending therethrough for removable engagement with the flexible circuit board means for securing the circuit board means to the second surface and for operable electrical connection with the electrical circuit for activation thereby, the electrical circuit being of an arrangement complementary to the decorative design whereby the activation of the light emitting diodes augments the effect of the decorative design.

5. An illuminated garment as set forth in claim 4 and including sheet means disposed against the circuit board means and having the peripheral edges thereof secured to the second surface for sandwiching the circuit board means between the sheet means and the second surface.

6. An illuminated garment as set forth in claim 4 wherein the flexible circuit board is constructed of a plastic material.

7. An illuminated garment as set forth in claim 4 wherein the garment is a shirt.

8. An illuminated garment as set forth in claim 7 wherein the shirt is constructed from a sweat shirt jersey material.

9. An illuminated garment as set forth in claim 4 wherein the activation of the light emitting diode means is of an intermittent arrangement providing a blinking type action for the illumination of the decorative design.

* * * * *